(12) United States Patent
Janicki et al.

(10) Patent No.: US 11,837,495 B2
(45) Date of Patent: Dec. 5, 2023

(54) CARRIER RING DESIGNS FOR CONTROLLING DEPOSITION ON WAFER BEVEL/EDGE

(71) Applicant: Lam Research Corporation, Fremont, CA (US)

(72) Inventors: Michael J. Janicki, Portland, OR (US); Brian Joseph Williams, Tigard, OR (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 17/644,754

(22) Filed: Dec. 16, 2021

(65) Prior Publication Data

US 2022/0115261 A1    Apr. 14, 2022

Related U.S. Application Data

(63) Continuation of application No. PCT/US2021/015487, filed on Jan. 28, 2021.
(Continued)

(51) Int. Cl.
*H01L 21/687* (2006.01)
*H01J 37/32* (2006.01)

(52) U.S. Cl.
CPC .. *H01L 21/68721* (2013.01); *H01J 37/32642* (2013.01); *H01J 37/32715* (2013.01);
(Continued)

(58) Field of Classification Search
CPC ......... H01L 21/68735; H01L 21/67115; H01L 21/68721; C23C 16/4585; C30B 31/14;
(Continued)

(56) References Cited

U.S. PATENT DOCUMENTS 5,848,889 A * 12/1998 Tietz ................. H01L 21/68735
432/259
6,040,011 A   3/2000 Yudovsky et al.
(Continued)

FOREIGN PATENT DOCUMENTS

CN    201075384 Y    6/2008
JP    2002246370 A   8/2002
(Continued)

OTHER PUBLICATIONS

International Preliminary Report on Patentability dated Jul. 28, 2022 in PCT Application No. PCT/US2021/013327.
(Continued)

*Primary Examiner* — Mahdi H Nejad
(74) *Attorney, Agent, or Firm* — Weaver Austin Villeneuve & Sampson LLP

(57) ABSTRACT

Various carrier ring designs and configurations to control an amount of deposition at a wafer's front side and bevel edge are provided. The carrier ring designs can control the amount of deposition at various locations of the wafer while deposition is performed on the wafer's back side, with no deposition desired on the front side of the wafer. These locations include front side, edge, and back side of bevel; and front and back side of the wafer. Edge profiles of the carrier rings are designed to control flow of process gases, flow of front side purge gas, and plasma effects. In some designs, through holes are added to the carrier rings to control gas flows. The edge profiles and added features can reduce or eliminate deposition at the wafer's front side and bevel edge.

18 Claims, 12 Drawing Sheets

Related U.S. Application Data

(60) Provisional application No. 62/975,146, filed on Feb. 11, 2020.

(52) U.S. Cl.
CPC .. *H01L 21/68735* (2013.01); *H01L 21/68785* (2013.01); *H01J 2237/332* (2013.01)

(58) Field of Classification Search
CPC ............. H01J 37/3264; H01J 37/32715; H01J 2237/332; H01J 37/32642
See application file for complete search history.

(56) References Cited

U.S. PATENT DOCUMENTS

| | | | | |
|---|---|---|---|---|
| 6,048,403 | A | * | 4/2000 | Deaton ............... C23C 16/4405 118/728 |
| 6,280,183 | B1 | * | 8/2001 | Mayur .................... C30B 25/12 432/259 |
| 6,374,512 | B1 | | 4/2002 | Guo et al. |
| 10,062,598 | B2 | * | 8/2018 | Ngo ........................ B05C 13/00 |
| 11,018,045 | B2 | * | 5/2021 | Seo .................. C23C 16/45565 |
| 2005/0245005 | A1 | | 11/2005 | Benson |
| 2007/0235660 | A1 | | 10/2007 | Hudson |
| 2008/0289766 | A1 | | 11/2008 | Heemstra et al. |
| 2011/0263123 | A1 | | 10/2011 | Gomi et al. |
| 2012/0018940 | A1 | | 1/2012 | Kumnig et al. |
| 2013/0269737 | A1 | | 10/2013 | Mizuno |
| 2014/0113458 | A1 | * | 4/2014 | Pan ................... H01L 21/67115 438/795 |
| 2014/0235063 | A1 | | 8/2014 | McMillin et al. |
| 2014/0273460 | A1 | * | 9/2014 | Reyland ............ H01L 21/76805 438/694 |
| 2014/0335698 | A1 | | 11/2014 | Singh et al. |
| 2015/0020736 | A1 | | 1/2015 | Pan et al. |
| 2015/0221539 | A1 | | 8/2015 | Ouye |
| 2016/0002778 | A1 | | 1/2016 | Ravi et al. |
| 2016/0177444 | A1 | | 6/2016 | Baldasseroni et al. |
| 2016/0289827 | A1 | | 10/2016 | Augustyniak et al. |
| 2016/0355928 | A1 | | 12/2016 | Toriya et al. |
| 2017/0278681 | A1 | | 9/2017 | Qi et al. |
| 2018/0090344 | A1 | | 3/2018 | Kim et al. |
| 2018/0122685 | A1 | * | 5/2018 | Breiling .............. C23C 16/4585 |
| 2018/0138074 | A1 | | 5/2018 | Lee et al. |
| 2019/0062918 | A1 | | 2/2019 | Shaikh et al. |
| 2019/0153592 | A1 | | 5/2019 | Bois et al. |
| 2020/0202291 | A1 | | 6/2020 | Yamamoto et al. |
| 2020/0248304 | A1 | * | 8/2020 | Huang .................. C30B 25/183 |
| 2020/0248307 | A1 | * | 8/2020 | Gurary ............. H01L 21/68764 |
| 2021/0062325 | A1 | * | 3/2021 | Ramalingam ....... C23C 14/0652 |
| 2021/0375591 | A1 | | 12/2021 | Chandrashekar et al. |
| 2022/0108912 | A1 | * | 4/2022 | Janicki .............. H01J 37/32449 |
| 2022/0259731 | A1 | * | 8/2022 | Tsuji .................. C23C 16/45591 |
| 2022/0293398 | A1 | * | 9/2022 | Jeong ................ H01J 37/32642 |
| 2023/0040885 | A1 | | 2/2023 | Gulabal et al. |

FOREIGN PATENT DOCUMENTS

| | | | |
|---|---|---|---|
| JP | 2010045200 | A | 2/2010 |
| JP | 2011035026 | A | 2/2011 |
| JP | 2015536048 | A | 12/2015 |
| KR | 20040094240 | A | 11/2004 |
| KR | 20060036846 | A | 5/2006 |
| KR | 20070031785 | A | 3/2007 |
| KR | 20150138675 | A | 12/2015 |
| KR | 20160075351 | A | 6/2016 |
| KR | 20160117261 | A | 10/2016 |
| KR | 20160117261 | A * | 10/2016 |
| KR | 20180053258 | A | 5/2018 |
| KR | 20190051291 | A | 5/2019 |
| KR | 20190056021 | A | 5/2019 |
| KR | 20200000460 | A | 1/2020 |
| KR | 20200135554 | A | 12/2020 |
| TW | 201401428 | A | 1/2014 |
| WO | WO-2014209489 | A1 | 12/2014 |
| WO | WO 2021146352 | A1 * | 1/2021 |
| WO | WO-2021179000 | A1 | 9/2021 |

OTHER PUBLICATIONS

U.S. Final Office Action dated Jul. 27, 2022, in U.S. Appl. No. 17/644,757.
International Preliminary Report on Patentability and written opinion dated Aug. 25, 2022 in Application PCT/US2021/015487.
KR Office Action dated Sep. 26, 2022 in Application No. KR10-2022-7001497.
KR Office Action dated Sep. 26, 2022 in Application No. KR10-2022-7001591.
KR Office Action dated Sep. 2, 2022, in Application No. KR10-2022-7024631 with English translation.
KR Office Action dated Jul. 26, 2022, in Application No. KR10-2022-7024631.
KR Search Report dated Jul. 25, 2022, in Application No. KR10-2022-7024631.
International Preliminary Report on Patentability dated Oct. 29, 2020 in PCT Application PCT/US2019/028362.
International Search Report & Written Opinion dated Aug. 9, 2019 in PCT Application PCT/US2019/028362.
KR Office Action dated Sep. 26, 2022 in Application No. KR10-2022-7001497 with English translation.
KR Office Action dated Sep. 26, 2022 in Application No. KR10-2022-7001591 with English translation.
U.S. Advisory Action dated Nov. 1, 2022, in U.S. Appl. No. 17/644,757.
U.S. Non-Final Office Action dated Dec. 14, 2022 in Application No. 17/644,757.
U.S. Appl. No. 17/758,797, inventors Gulabal et al., filed Jul. 13, 2022.
U.S. Appl. No. 29/864,203, inventors Huang et al., filed May 13, 2022.
International Preliminary Report on Patentability dated Jan. 5, 2023 in PCT Application No. PCT/US2021/038210.
International Search Report and Written Opinion dated Apr. 4, 2023 in Application No. PCT/US2022/080276.
KR Office Action dated Feb. 21, 2023, in Application No. KR10-2022-7024631 with English translation.
TW Office Action dated Dec. 13, 2022 in Application No. TW108113695 with English translation.
U.S. Final Office Action dated Apr. 5, 2023 in U.S. Appl. No. 17/644,757.
U.S. Appl. No. 18/002,614, inventors Linebarger et al., filed Dec. 19, 2022.
KR Office Action dated Mar. 28, 2023, in Application No. KR10-2022-7001497 with English translation.
KR Office Action dated Mar. 28, 2023, in Application No. KR10-2022-7001591 with English translation.
JP Office Action dated May 30, 2023 in Application No. JP 2020-557974 with English translation.
KR Office Action dated Jul. 27, 2023, in Application No. KR10-2022-7024631 with English Translation.
U.S. Advisory Action dated Jun. 27, 2023, in U.S. Appl. No. 17/644,757.
U.S. Notice of Allowance dated Jul. 20, 2023, in U.S. Appl. No. 17/644,757.
International Search Report and Written Opinion dated Oct. 13, 2021, in application No. PCT/US2021/038210.
International Search Report and Written Opinion dated Apr. 29, 2021 in PCT Application No. PCT/US2021/013327.
International Search Report and Written Opinion dated May 20, 2021 in PCT Application No. PCT/US2021/015487.
KR Office Action dated Apr. 3, 2022, in Application No. KR1020227001497 with English translation.
KR Office Action dated Apr. 3, 2022, in Application No. KR1020227001591 with English translation.
KR Office Action dated Mar. 18, 2016 in KR Application No. 10-2012-0004935.

(56) References Cited

OTHER PUBLICATIONS

TW Search Report & Grant Decision dated Jan. 25, 2015 in TW Application No. 102116792.
U.S. Office Action dated Mar. 17, 2022 in U.S. Appl. No. 17/644,757.

* cited by examiner

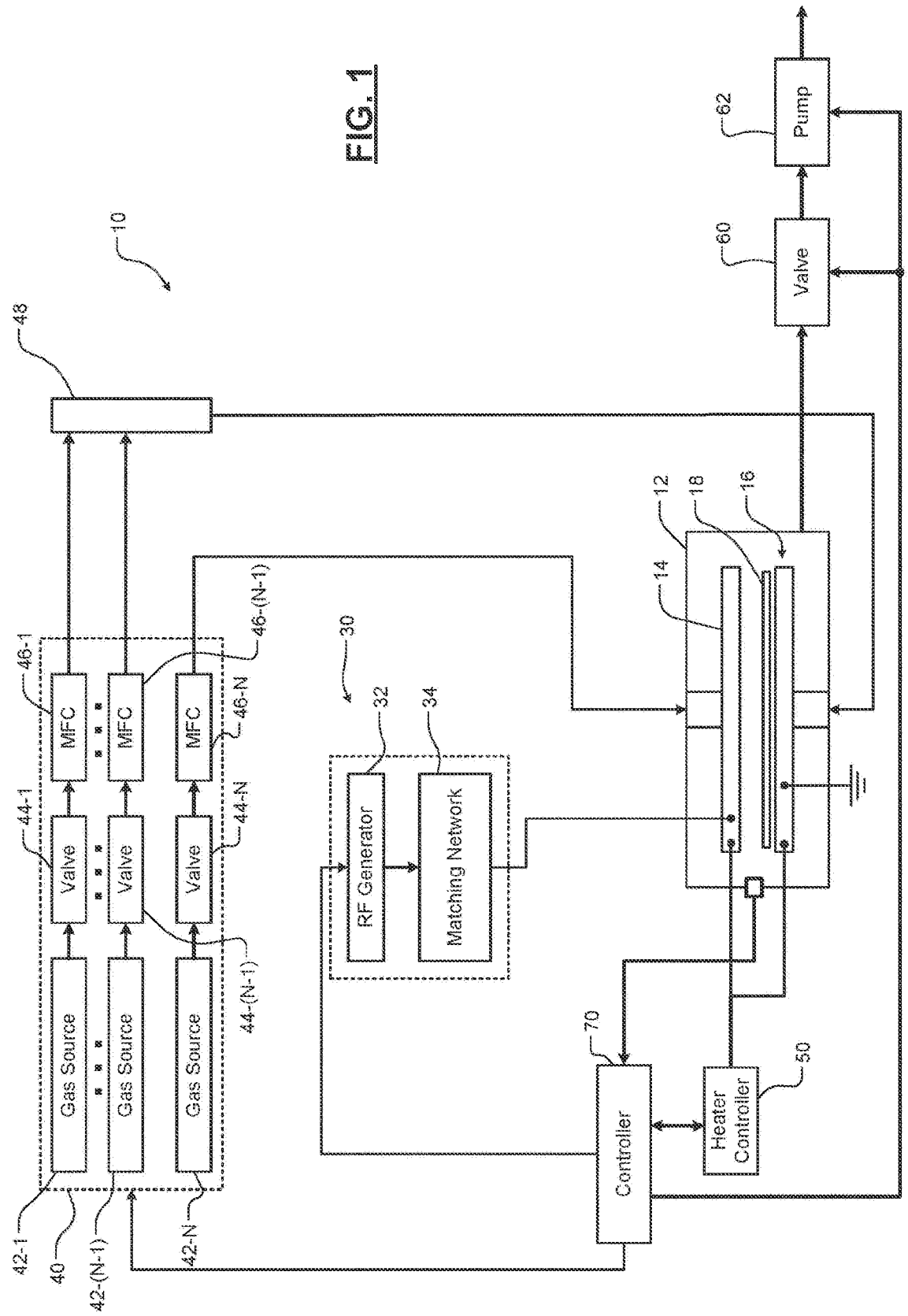

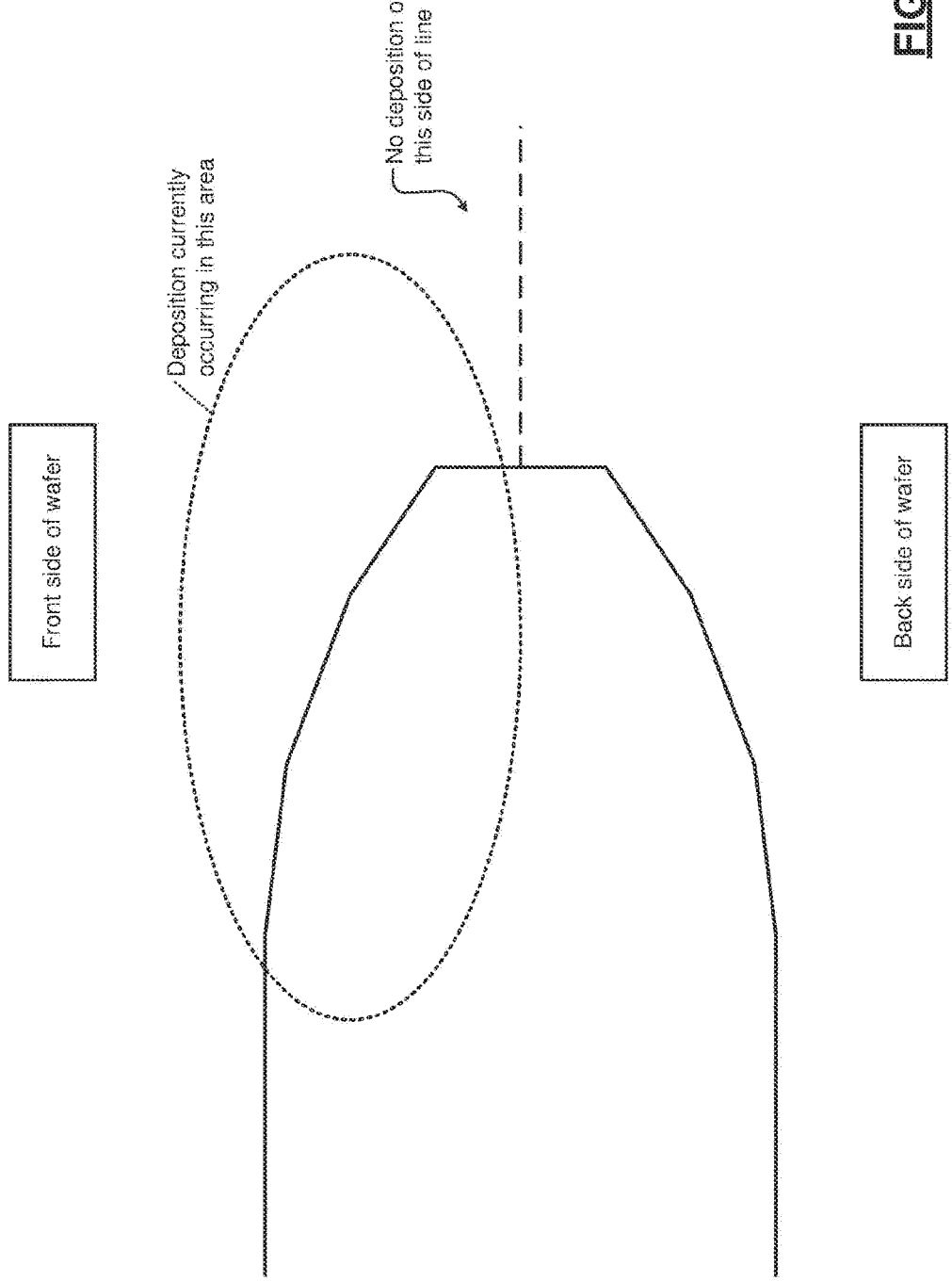

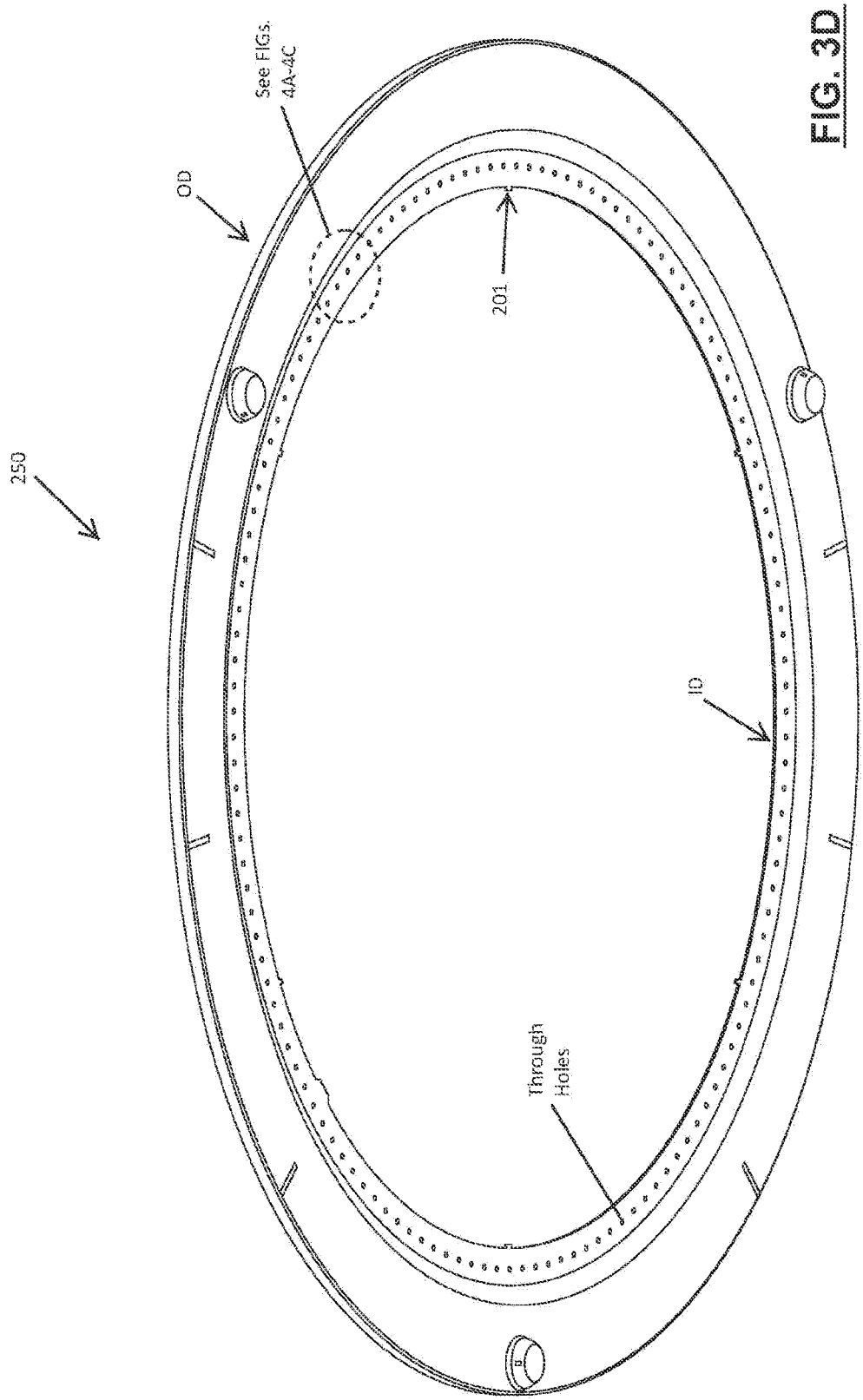

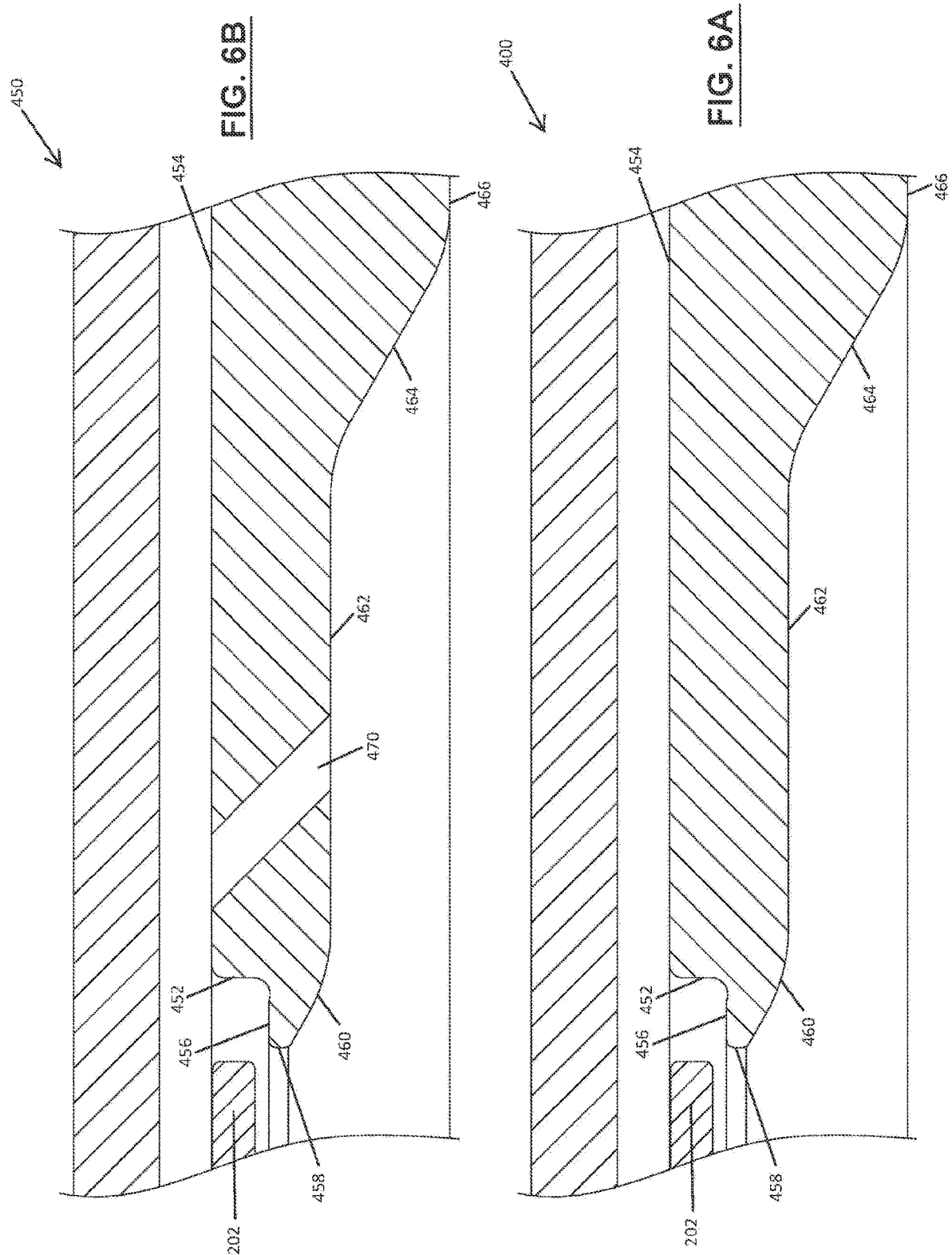

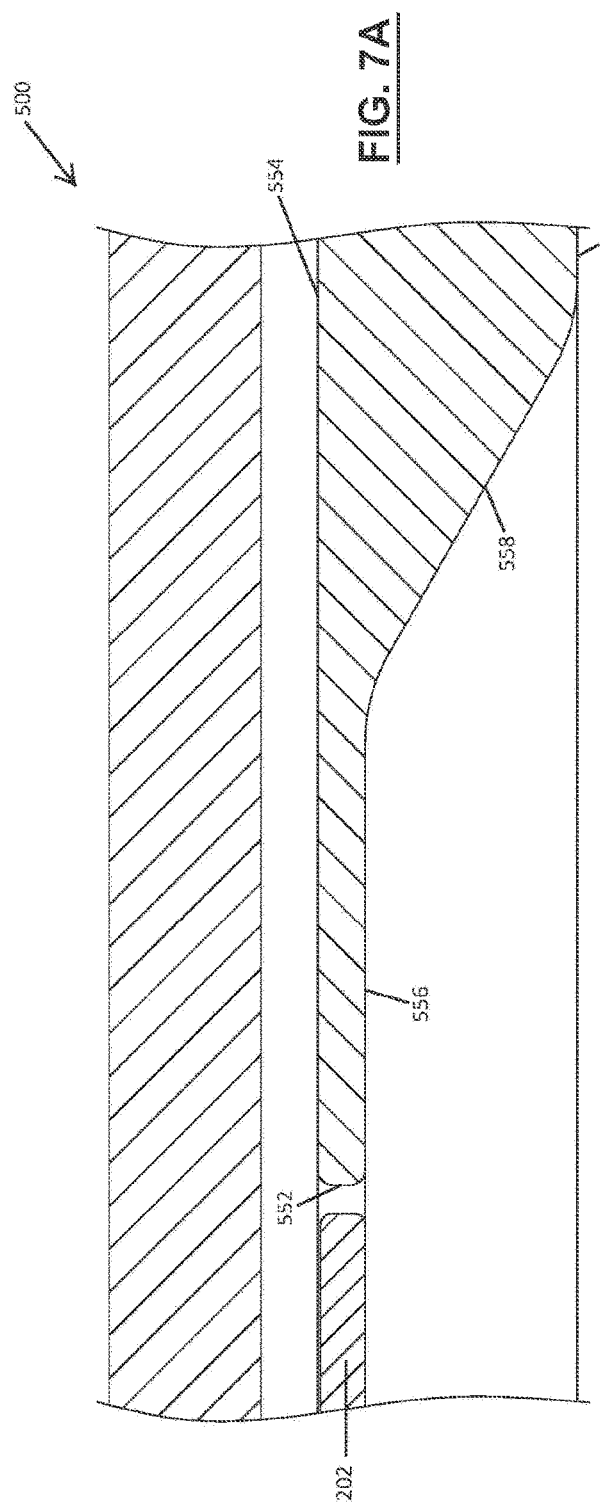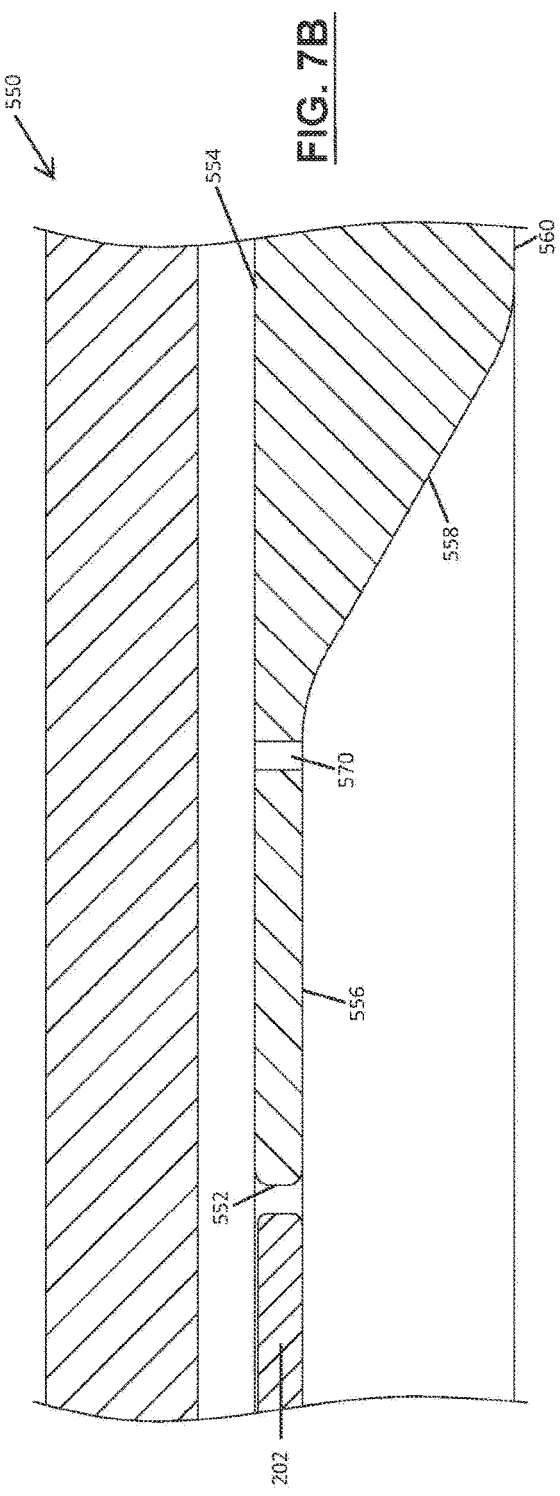

CARRIER RING DESIGNS FOR CONTROLLING DEPOSITION ON WAFER BEVEL/EDGE

CROSS-REFERENCE TO RELATED APPLICATIONS

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD

The present disclosure relates generally to substrate processing systems and more particularly to carrier ring designs for controlling deposition on wafer bevel/edge.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments on substrates such as semiconductor wafers. Examples of processes that may be performed on a substrate include, but are not limited to, a plasma enhanced chemical vapor deposition (PECVD) process, a chemically enhanced plasma vapor deposition (CEPVD) process, and a sputtering physical vapor deposition (PVD) process. Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal in a processing chamber of the substrate processing system. During deposition, gas mixtures including one or more precursors are introduced into the processing chamber, and plasma is struck to activate chemical reactions. A computer-controlled robot typically transfers substrates from one processing chamber to another in a sequence in which the substrates are to be processed.

SUMMARY

A ring shaped structure to surround a semiconductor substrate in a processing chamber comprises an inner portion of the ring shaped structure having an inner diameter and an outer portion of the ring shaped structure having an outer diameter. The inner portion includes a first portion that descends from a top surface of the ring shaped structure, a second portion that extends from a bottom end of the first portion horizontally towards the semiconductor substrate, a third portion that descends vertically from a distal end of the second portion, a fourth portion that extends horizontally from a bottom end of the third portion towards the outer diameter, a fifth portion that descends from a distal end of the fourth portion towards the outer diameter at an acute angle relative to the second portion, and a sixth portion that extends horizontally from a bottom end of the fifth portion towards the outer portion.

In other features, the top surface of the ring shaped structure is coplanar with a top surface of the semiconductor substrate, and the first portion descends vertically from the top surface of the ring shaped structure for a distance that is about a thickness of the semiconductor substrate.

In another feature, the first portion is spaced from an outer edge of the semiconductor substrate by a predetermined distance.

In another feature, the distal end of the second portion extends under an outer edge of the semiconductor substrate.

In another feature, a first end of the third portion forms a right angle at the distal end of the second portion.

In another feature, the ring shaped structure further comprises a plurality of through holes extending from the top surface of the ring shaped structure through the fourth portion of the ring shaped structure.

In another feature, the through holes have a predetermined diameter and are arranged at a predetermined radial distance from the first portion of the ring shaped structure.

In another feature, the through holes descend from the top surface of the ring shaped structure to the fourth portion of the ring shaped structure at an angle other than 90 degrees.

In another feature, the through holes descend vertically from the top surface of the ring shaped structure to the fourth portion of the ring shaped structure.

In another feature, the through holes descend from the top surface of the ring shaped structure to the fourth portion of the ring shaped structure at a 45 degree angle relative to the first portion that descends vertically from the top surface of the ring shaped structure.

In another feature, the ring shaped structure further comprises a plurality of tabs to support the semiconductor substrate.

In still other features, a ring shaped structure to surround a semiconductor substrate in a processing chamber comprises an inner portion of the ring shaped structure having an inner diameter and an outer portion of the ring shaped structure having an outer diameter. The inner portion includes a first portion that descends from a top surface of the ring shaped structure, a second portion that extends from a bottom end of the first portion horizontally towards the semiconductor substrate, a third portion that descends vertically from a distal end of the second portion, a fourth portion that descends from a bottom end of the third portion towards the outer portion at a first acute angle relative to the second portion, a fifth portion that extends horizontally from a bottom end of the fourth portion towards the outer diameter, a sixth portion that descends from a distal end of the fifth portion towards the outer diameter at a second acute angle relative to the second portion, and a seventh portion that extends horizontally from a bottom end of the sixth portion towards the outer portion.

In other features, the top surface of the ring shaped structure is coplanar with a top surface of the semiconductor substrate, and the first portion descends vertically from the top surface of the ring shaped structure for a distance that is about a thickness of the semiconductor substrate.

In another feature, the first portion is spaced from an outer edge of the semiconductor substrate by a predetermined distance.

In another feature, the distal end of the second portion extends under an outer edge of the semiconductor substrate.

In another feature, a first end of the third portion forms a right angle at the distal end of the second portion.

In another feature, the fourth portion descends at a 30 degree angle relative to the second portion.

In another feature, the ring shaped structure further comprises a plurality of through holes extending from the top surface of the ring shaped structure through the fifth portion of the ring shaped structure.

In another feature, the through holes have a predetermined diameter and are arranged at a predetermined radial distance from the first portion of the ring shaped structure.

In another feature, the through holes descend from the top surface of the ring shaped structure to the fifth portion of the ring shaped structure at an angle other than 90 degrees.

In another feature, the through holes descend vertically from the top surface of the ring shaped structure to the fourth portion of the ring shaped structure.

In another feature, the through holes descend from the top surface of the ring shaped structure to the fifth portion of the ring shaped structure at a 45 degree angle relative to the first portion that descends vertically from the top surface of the ring shaped structure.

In another feature, the ring shaped structure further comprises a plurality of tabs to support the semiconductor substrate.

In still other features, a ring shaped structure to surround a semiconductor substrate in a processing chamber comprises an inner portion of the ring shaped structure having an inner diameter and an outer portion of the ring shaped structure having an outer diameter. The inner portion includes a first portion that descends from a top surface of the ring shaped structure, a second portion that extends initially upwards and subsequently horizontally outwards towards the semiconductor substrate from a bottom end of the first portion, a third portion that descends vertically from a distal end of the second portion, a fourth portion that descends from a bottom end of the third portion towards the outer portion at a first acute angle relative to the top surface of the ring shaped structure, a fifth portion that extends horizontally from a bottom end of the fourth portion towards the outer diameter, a sixth portion that descends from a distal end of the fifth portion towards the outer diameter at a second acute angle relative to the top surface of the ring shaped structure, and a seventh portion that extends horizontally from a bottom end of the sixth portion towards the outer portion.

In other features, the top surface of the ring shaped structure is coplanar with a top surface of the semiconductor substrate, and the first portion descends vertically from the top surface of the ring shaped structure for a distance greater than a thickness of the semiconductor substrate.

In another feature, the first portion is spaced from an outer edge of the semiconductor substrate by a predetermined distance.

In other features, a horizontal portion of the second portion is vertically spaced from a bottom surface of the semiconductor substrate by a first predetermined distance, and the third portion is horizontally spaced from an outer edge of the semiconductor substrate by a second predetermined distance.

In another feature, the ring shaped structure further comprises a plurality of through holes extending from the top surface of the ring shaped structure through the fifth portion of the ring shaped structure.

In another feature, the through holes have a predetermined diameter and are arranged at a predetermined radial distance from the first portion of the ring shaped structure.

In another feature, the through holes descend from the top surface of the ring shaped structure to the fifth portion of the ring shaped structure at an angle other than 90 degrees.

In another feature, the through holes descend vertically from the top surface of the ring shaped structure to the fourth portion of the ring shaped structure.

In another feature, the through holes descend from the top surface of the ring shaped structure to the fifth portion of the ring shaped structure at a 45 degree angle relative to the first portion that descends vertically from the top surface of the ring shaped structure.

In another feature, the ring shaped structure further comprises a plurality of tabs to support the semiconductor substrate.

In still other features, a ring shaped structure to surround a semiconductor substrate in a processing chamber comprises an inner portion of the ring shaped structure having an inner diameter, and an outer portion of the ring shaped structure having an outer diameter. The inner portion includes a first portion that descends from a top surface of the ring shaped structure, a second portion that extends from a bottom end of the first portion horizontally towards the outer diameter of the ring shaped structure, a third portion that descends from a distal end of the second portion towards the outer diameter at an acute angle relative to the second portion, and a fourth portion that extends horizontally from a bottom end of the third portion towards the outer portion.

In other features, the top surface of the ring shaped structure is coplanar with a top surface of the semiconductor substrate, and the first portion descends vertically from the top surface of the ring shaped structure for a distance that is about a thickness of the semiconductor substrate.

In another feature, the first portion is spaced from an outer edge of the semiconductor substrate by a predetermined distance.

In another feature, the ring shaped structure further comprises a plurality of through holes extending from the top surface of the ring shaped structure through the second portion of the ring shaped structure.

In another feature, the through holes have a predetermined diameter and are arranged at a predetermined radial distance from the first portion of the ring shaped structure.

In another feature, the through holes are closer to the distal end of the second portion than to the first portion of the ring shaped structure.

In another feature, the through holes descend vertically from the top surface of the ring shaped structure to the second portion of the ring shaped structure.

In another feature, the ring shaped structure further comprises a plurality of tabs to support the semiconductor substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 shows an example of a substrate processing system comprising a processing chamber;

FIG. 2 shows a portion of a semiconductor wafer indicating areas where deposition is undesirable and where deposition is prevented or minimized by the carrier rings of the present disclosure;

FIGS. 3A-3D show examples of carrier rings with and without through holes according to the present disclosure;

FIGS. 6A-6C show examples of a third carrier ring design with and without through holes according to the present disclosure; and FIGS. 7A and 7B show examples of a fourth carrier ring design with and without through holes according to the present disclosure.

In the drawings, reference numbers may be reused to identify similar and/or identical elements.

DETAILED DESCRIPTION

Figure 3A:
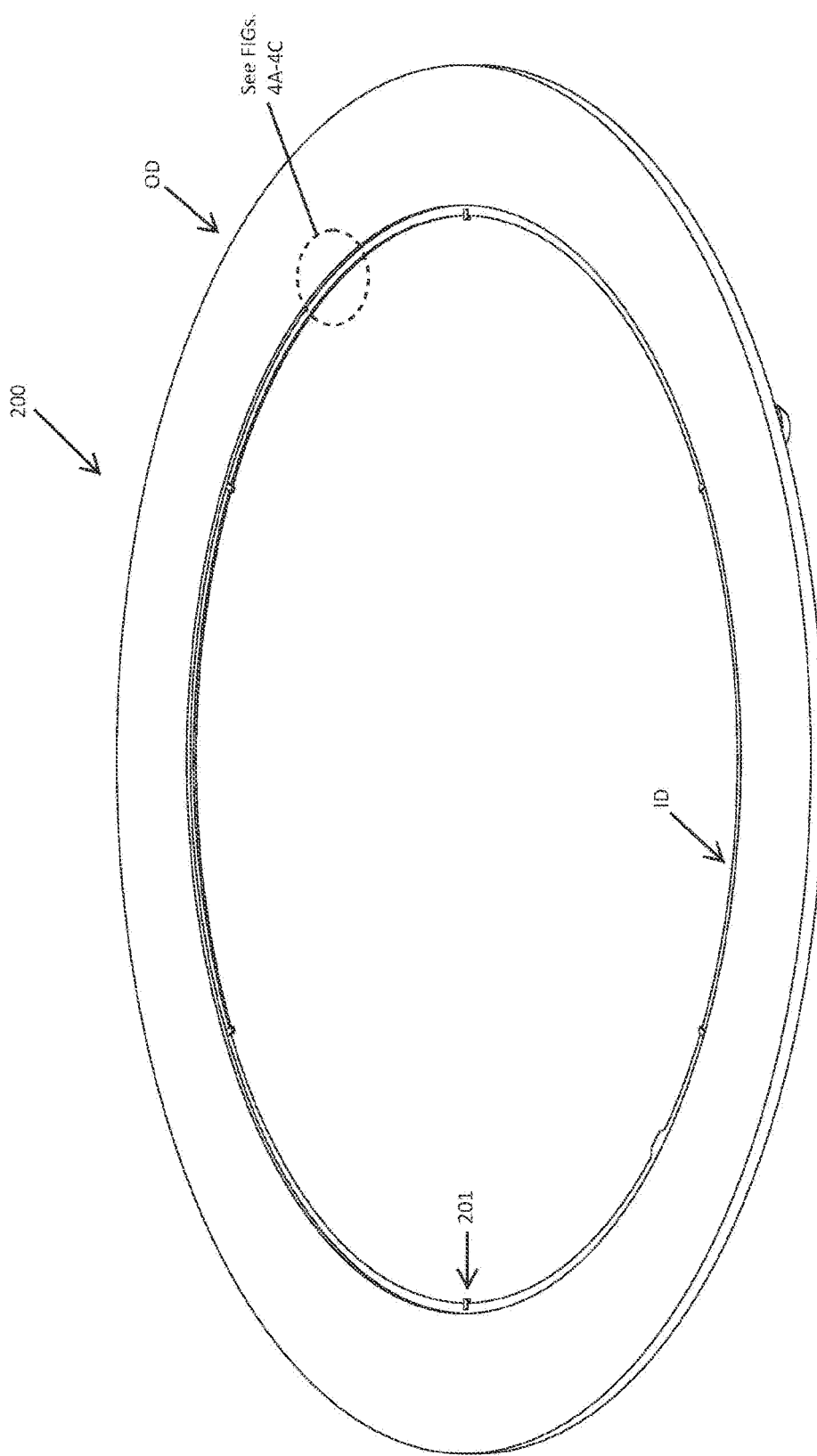

During a deposition process, a material intended to be deposited only on a bottom surface of a semiconductor wafer (hereinafter "the wafer") sometimes also gets deposited at the wafer's front side, edge, and bevel. Current carrier ring designs allow an unacceptable amount of deposition on the wafer's front side and bevel edge. In some carrier ring designs, deposition on the wafer's back side (i.e., under side or the surface opposite to the top surface) is depleted in a uniform manner at the carrier ring transition.

The present disclosure provides various carrier ring designs and configurations to control the amount of deposition at the wafer's front side and bevel edge. The carrier ring designs can control the amount of deposition at all three locations of the wafer: front side of bevel, edge and back side of bevel, and front and back side of the wafer (with no deposition desired on the front side). Specifically, edge profiles of the carrier rings are designed to control flow of process gases, flow of front side purge gas, and plasma effects. In some designs, through holes are added to the carrier rings to control gas flows. The edge profiles and added features can reduce or eliminate deposition at the wafer's front side and bevel edge. These and other features of the carrier ring designs and configurations according to the present disclosure are now described below in detail.

The present disclosure is organized as follows. Initially, an example of a processing chamber is shown and described with reference to FIG. 1. Thereafter, the problem being solved by the carrier ring designs of the present disclosure is shown and described with reference to FIG. 2. Subsequently, various designs and structural details of the carrier rings according to the present disclosure are shown and described with reference to FIGS. 3A-7B.

FIG. 1 shows an example of a substrate processing system 10 including a processing chamber 12 that encloses other components of the substrate processing system 10 and contains RF plasma (if used). The processing chamber 12 includes a showerhead 14 and a substrate support assembly 16. A substrate 18 is arranged on the substrate support assembly 16. As explained below, the carrier rings of the present disclosure are used with the substrate support assembly 16 and include a plurality of tabs that support the substrate 18 during processing. Process gases and vaporized chemistry are introduced through the substrate support assembly 16 for depositing material on the back (bottom) side of the substrate 18. The showerhead 14 introduces a purge gas to prevent deposition on the front (top) side of the substrate 18.

If plasma is used, the plasma can be direct or remote plasma. In this example, an RF generating system 30 generates and outputs an RF voltage to the showerhead 14. The substrate support assembly 16 is grounded (the other is DC grounded, AC grounded, or floating). For example only, the RF generating system 30 may include an RF voltage generator 32 that generates the RF voltage that is fed by a matching network 34 to the showerhead 14. Alternately, the plasma may be delivered by a remote plasma source (not shown).

A gas delivery system 40 includes one or more gas sources 42-1, ..., 42-(N−1), and 42-N (collectively gas sources 42), where N is a positive integer. The gas sources 42 supply one or more process gases, precursor gases, cleaning gases, purge gases, etc. to the processing chamber 12. The gas sources 42 are connected by valves 44-1, ..., 44-(N−1), and 44-N (collectively valves 44) and mass flow controllers 46-1, ..., 46-(N−1), and 46-N (collectively mass flow controllers 46) to a manifold 48. An output of the manifold 48 is fed to the substrate support assembly 16. Vaporized precursors may also be used. For some vaporized precursors, no MFC is used. The gas delivery system 40 delivers a purge gas to the showerhead 14.

A heater controller 50 may be connected to a heater element (not shown) arranged in the substrate support assembly 16 and in the showerhead 14. The heater controller 50 may be used to control a temperature of the showerhead 14, the substrate support assembly 16 and the substrate 18. A valve 60 and pump 62 may be used to evacuate reactants from the processing chamber 12. A controller 70 may be used to control components of the substrate processing system 10. For example only, the controller 70 may be used for controlling flow of process gases and purge gases, monitoring process parameters such as temperature, pressure, power, etc., striking and extinguishing plasma, removing reactants, etc.

FIG. 2 shows a portion of a wafer with its bevel edge. As indicated, deposition on the front side and bevel edge of the wafer is undesirable. The carrier ring designs according to the present disclosure can prevent or minimize the deposition on the front side and bevel edge of the wafer (specifically, on the portion of the wafer's bevel edge that is above the horizontal dashed line).

Below are various designs of carrier rings that are arranged around a wafer in a processing chamber. Views of complete rings are shown only for the first carrier ring design. Views of complete rings are omitted for the second, third, and fourth carrier designs. However, the geometric and structural details are shown and described for all four carrier ring designs.

Figure 3B:
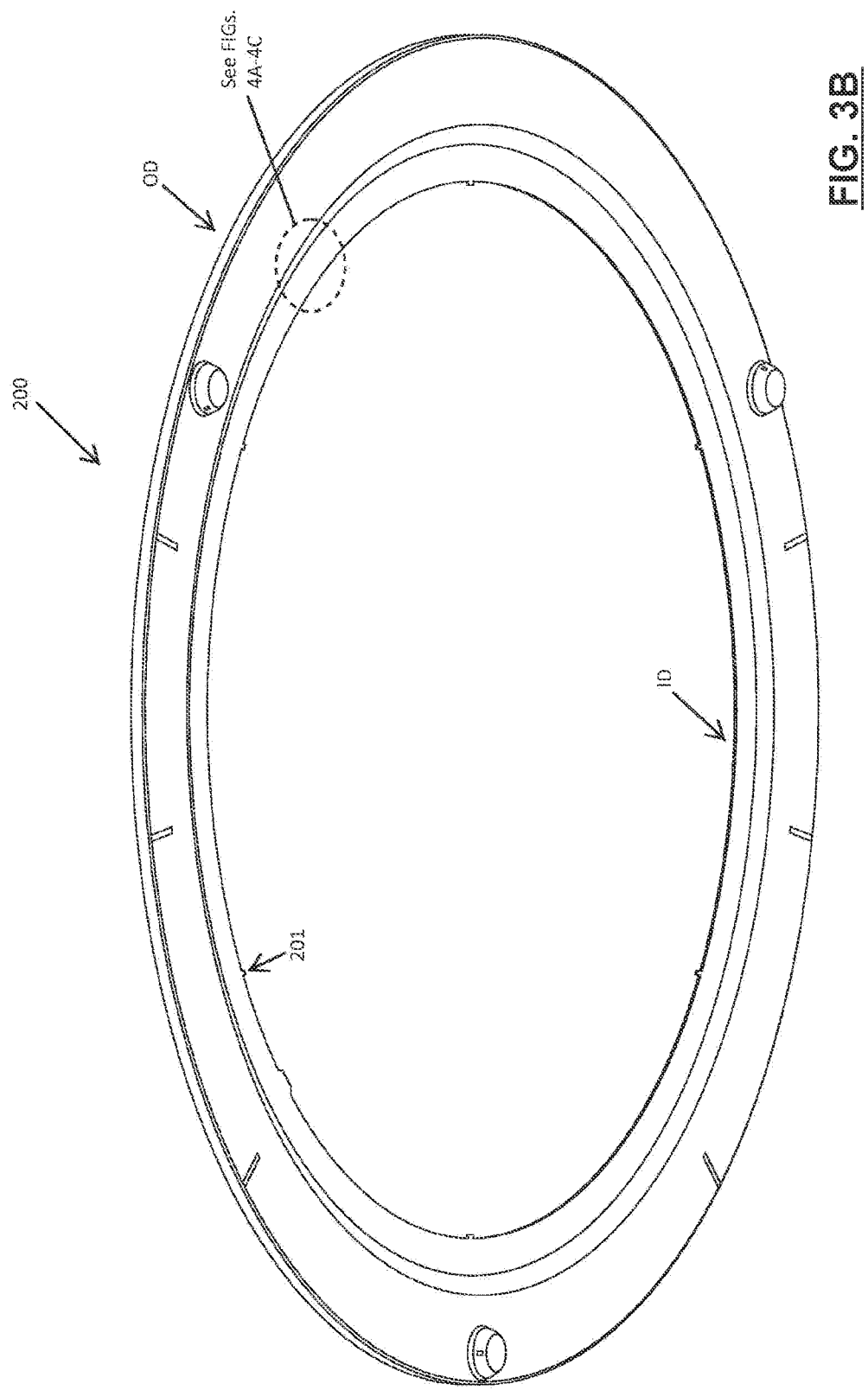

FIGS. 3A-3D show examples of a carrier ring according to the first design of the present disclosure. FIGS. 3A and 3B show a carrier ring 200 without through holes according to the first design. FIG. 3A shows a top view of the carrier ring 200 without through holes according to the first design. FIG. 3B shows a bottom view of the carrier ring 200 without through holes according to the first design.

As shown, the carrier ring 200 according to the first design (and all other carrier ring designs with and without through holes described below) is annular, has an inner diameter (ID) and an outer diameter (OD). The inner diameter (ID) generally surrounds a wafer (element 202 shown in FIGS. 4A-7B) in a processing chamber. The carrier ring 200 according to the first design (and all other carrier ring designs with and without through holes described below) includes a plurality of tabs 201 (e.g., six tabs are shown in the example) to support the wafer 202 during processing. The top surface of the carrier ring 200 is generally coplanar with the top surface of the wafer 202. The geometry and structural profile or shape of the inner edge of the carrier ring 200 indicated by a dotted oval is shown and described below in detail with reference to FIGS. 4A-4C. The geometry and structural profile or shape of the inner edge (i.e., the design of surface profile) of each of the four carrier ring designs is different as described below with reference to FIGS. 4A-7B in detail.

Figure 3C:
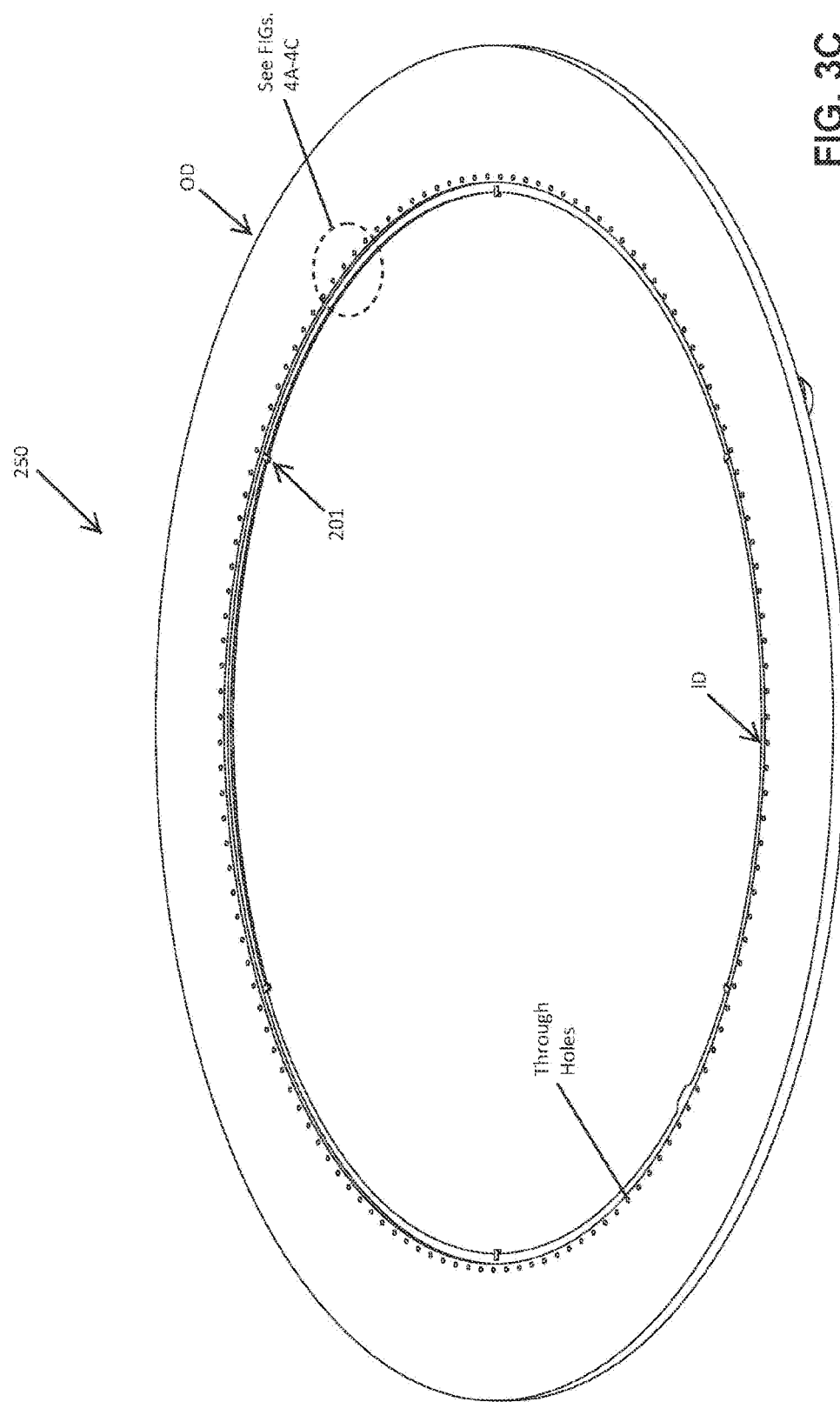

FIGS. 3C and 3D show examples of a carrier ring 250 with through holes according to the first design. The only difference between the carrier rings 200 and 250 is that the carrier ring 200 is without the through holes, and the carrier ring 250 is with the through holes. The carrier rings 200 and 250 are identical in all other respects. FIG. 3C shows a top view of the carrier ring 250 with through holes according to the first design. FIG. 3D shows a bottom view of the carrier ring 250 with through holes according to the first design. The geometry and structural profile or shape of the inner edge of the carrier ring 250 indicated by a dotted oval is shown and described below in detail with reference to FIGS. 4A-4C. As described below in detail, the geometry and arrangement of the through holes differ for each of the four carrier ring designs.

Figure 4A:
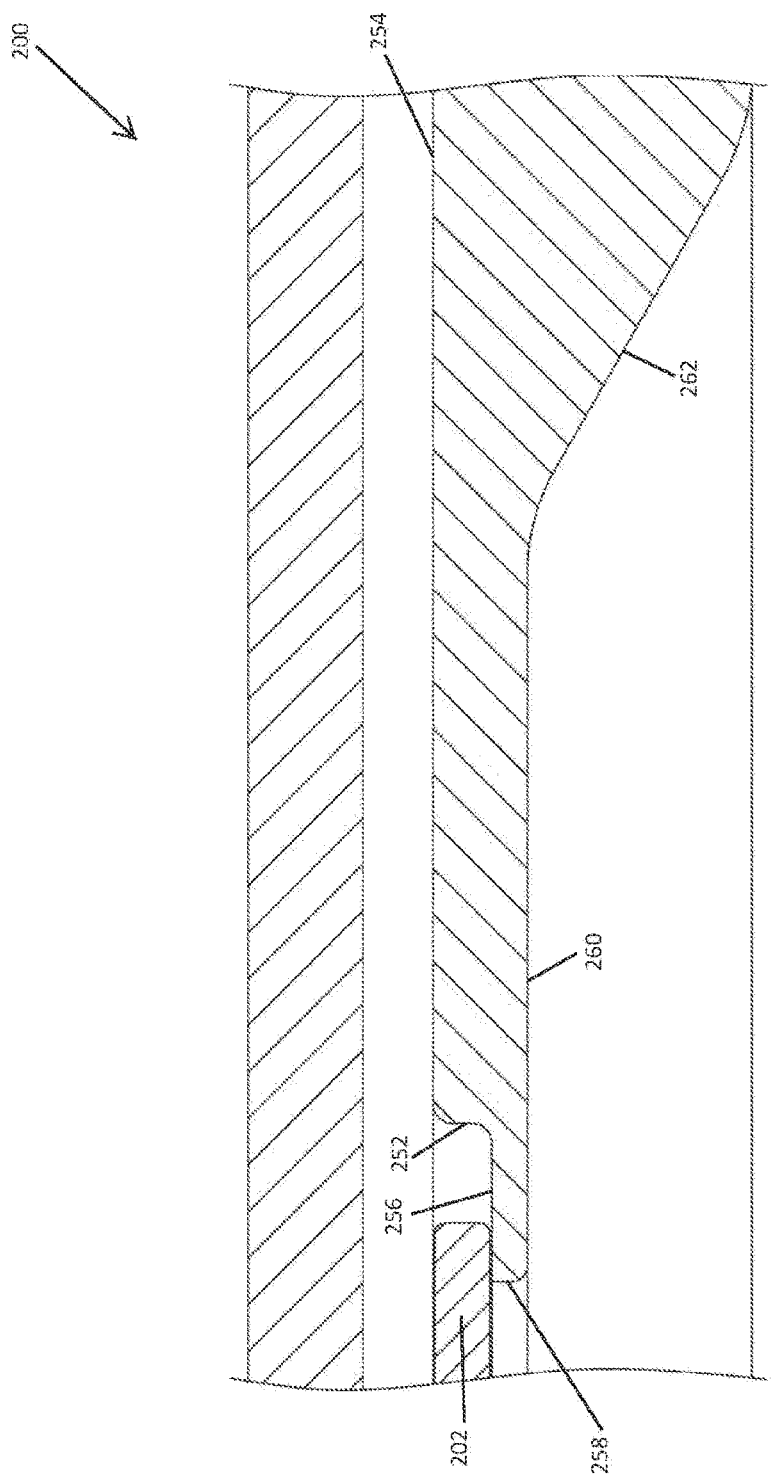
FIGS. 4A-4C show examples of a first carrier ring design with and without through holes according to the present disclosure.
Figure 4B:
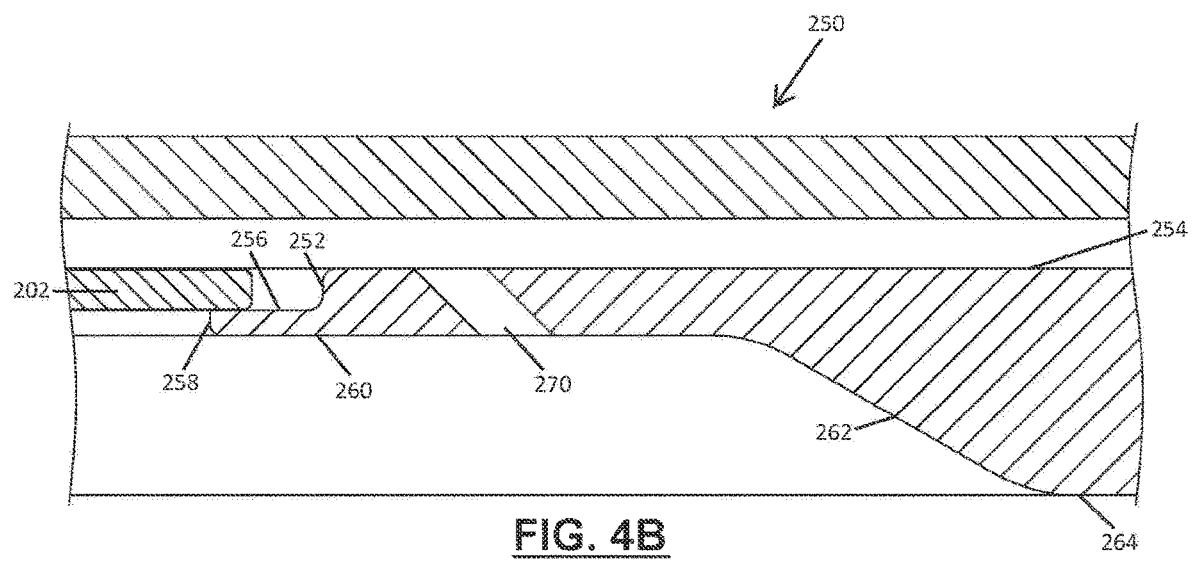
Figure 4C:
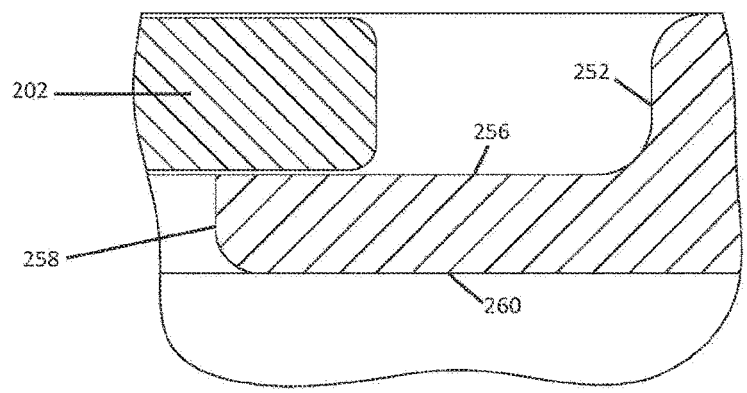

FIGS. 4A-4C show the first design (i.e., the first design of surface profile) of the carrier rings 200 and 250 according to the present disclosure in detail. The carrier rings 200 and 250 are annular or have a ring shaped structure to surround a semiconductor substrate (e.g., the wafer 202) in a processing chamber. FIG. 4A shows the carrier ring 200 without through holes. FIG. 4B shows the carrier ring 250 with through holes. FIG. 4C shows the structural details of the inner portion of the carrier rings 200 and 250 that are identical. The structural details of the carrier rings 200 and 250 are described below with reference to the carrier ring 250. It should be understood that other than the through holes, the description of the carrier ring 250 is identical for the carrier ring 200.

The carrier ring 250 comprises an inner portion having an inner diameter (ID) and an outer portion having an outer diameter (OD). The inner portion of the carrier ring 250 includes a first portion 252 that descends from a top surface 254 of the carrier ring 250. A second portion 256 of the carrier ring 250 extends from a bottom end of the first portion 252 of the carrier ring 250 horizontally (i.e., parallel to the top surface 254 of the carrier ring 250) towards the wafer 202. A third portion 258 of the carrier ring 250 descends vertically (i.e., perpendicular to the top surface 254 of the carrier ring 250) from a distal end of the second portion 256 of the carrier ring 250. A fourth portion 260 of the carrier ring 250 extends horizontally (i.e., parallel to the top surface 254 of the carrier ring 250) from a bottom end of the third portion 258 of the carrier ring 250 towards the outer diameter (OD) of the carrier ring 250.

A fifth portion 262 of the carrier ring 250 descends from a distal end of the fourth portion 260 of the carrier ring 250 towards the outer diameter (OD) or the outer portion of the carrier ring 250 at an acute angle relative to the second portion 256 and the top surface 254 of the carrier ring 250. A sixth portion 264 of the carrier ring 250 extends horizontally (i.e., parallel to the top surface 254 of the carrier ring 250) from a bottom end of the fifth portion 262 of the carrier ring 250 towards the outer portion or the outer diameter (OD) of the carrier ring 250.

The top surface 254 of the carrier ring 250 is coplanar with a top surface of the wafer 202. The first portion 252 of the carrier ring 250 descends vertically (i.e., perpendicularly) from the top surface 254 of the carrier ring 250 for a distance that is approximately equal to a thickness of the wafer 202. The first portion 252 of the carrier ring 250 is spaced from an outer edge (e.g., an OD) of the wafer 202 by a predetermined distance. The distal end of the second portion 256 of the carrier ring 250 extends under the outer edge of the wafer 202. A first end of the third portion 258 of the carrier ring 250 forms a right angle (i.e., a sharp corner) at the distal end of the second portion 256 of the carrier ring 250.

The carrier ring 250 (but not the carrier ring 200) comprises a plurality of through holes 270 extending from the top surface 254 of the carrier ring 250 through the fourth portion 260 of the carrier ring 250. The through holes 270 of the carrier ring 250 have a predetermined diameter and are arranged at a predetermined radial distance from the first portion 252 of the carrier ring 250. The through holes 270 of the carrier ring 250 descend from the top surface 254 of the carrier ring 250 to the fourth portion 260 of the carrier ring 250 at an angle other than 90 degrees. For example, the through holes 270 of the carrier ring 250 descend from the top surface 254 of the carrier ring 250 to the fourth portion 260 of the carrier ring 250 at a 45 degree angle relative to the first portion 252 that descends vertically (i.e., perpendicularly) from the top surface 254 of the carrier ring 250. Stated differently, the through holes 270 of the carrier ring 250 descend from the top surface 254 of the carrier ring 250 to the fourth portion 260 of the carrier ring 250 at a 45 degree angle relative to the top surface 254 of the carrier ring 250.

Figure 5A:
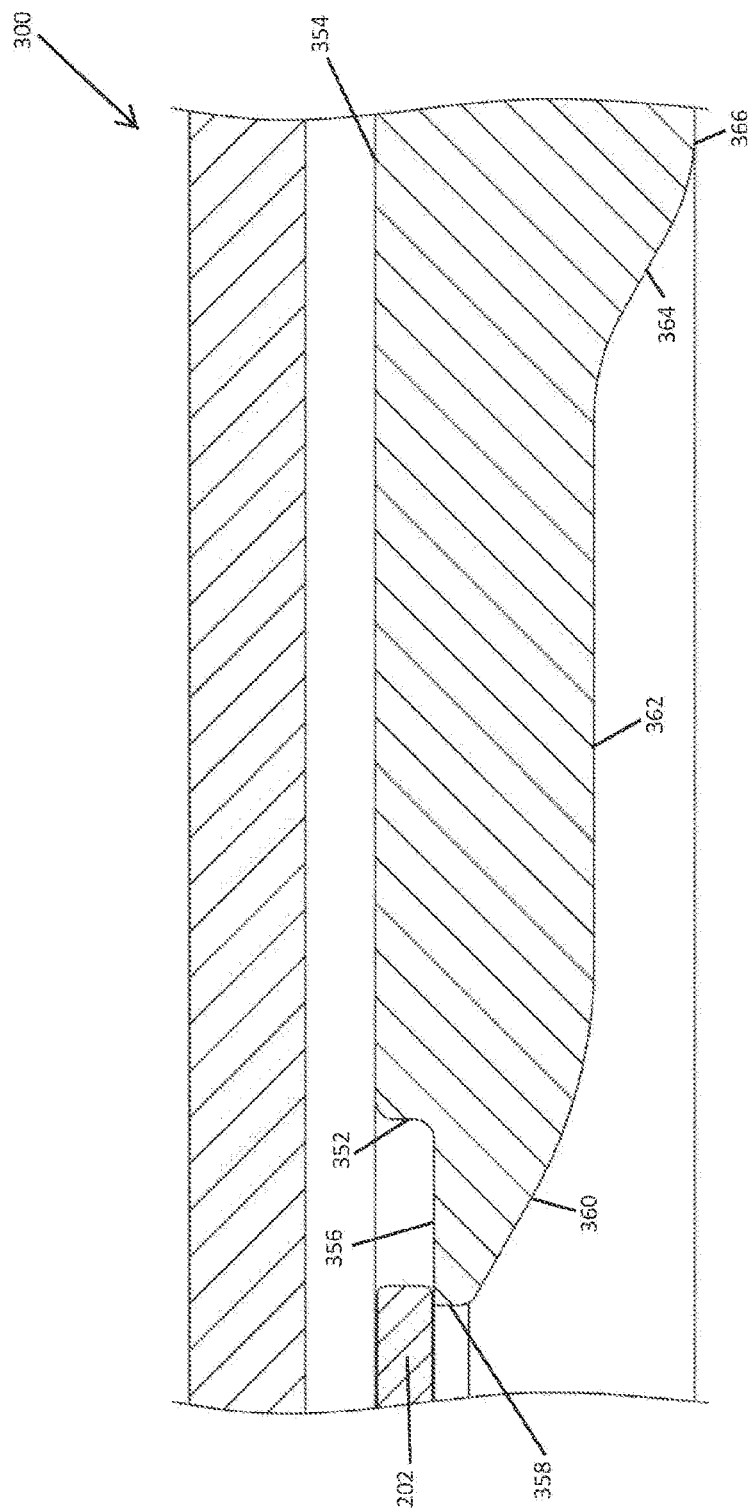
FIGS. 5A-5C show examples of a second carrier ring design with and without through holes according to the present disclosure.
Figure 5B:
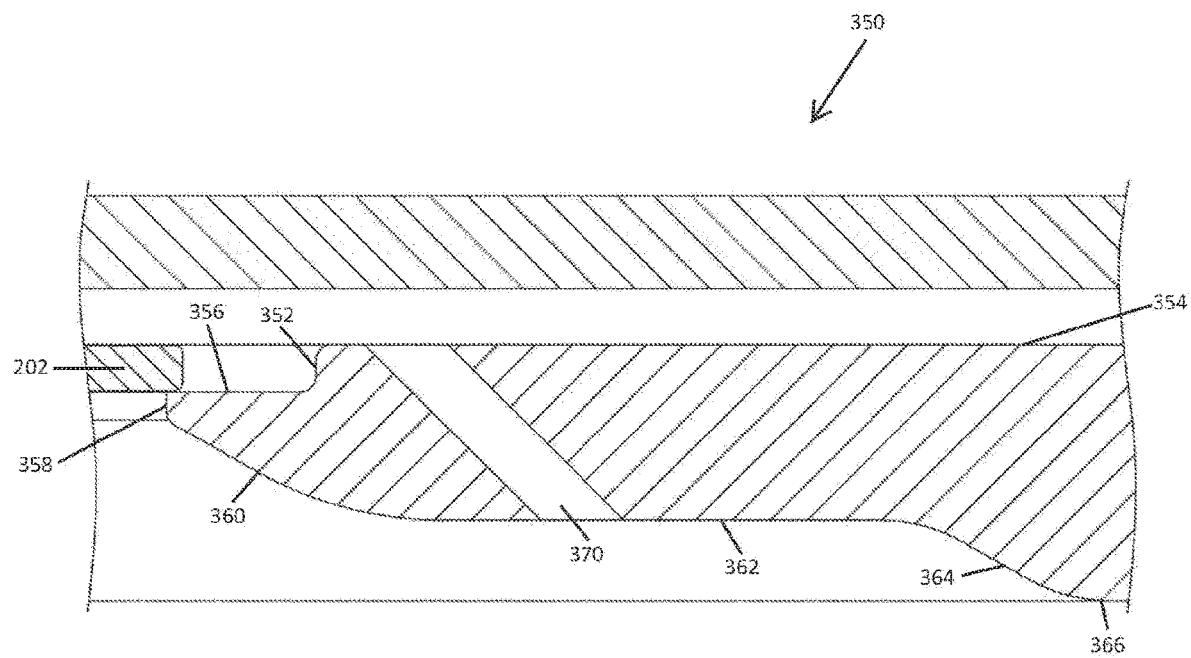
Figure 5C:
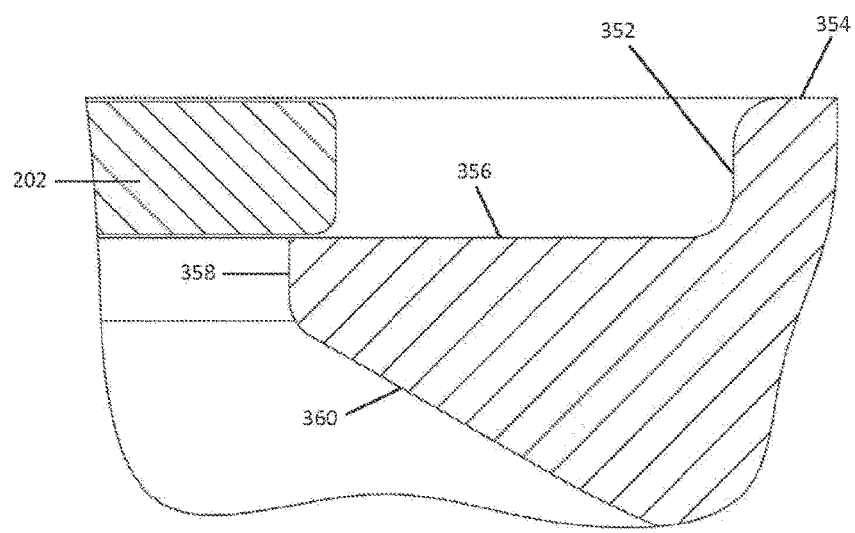

FIGS. 5A-5C show the second design (i.e., the second design of surface profile) of carrier rings 300 and 350 according to the present disclosure in detail. The carrier rings 300 and 350 are annular or have a ring shaped structure to surround a semiconductor substrate (e.g., the wafer 202) in a processing chamber. FIG. 5A shows the carrier ring 300 without through holes. FIG. 5B shows the carrier ring 350 with through holes. FIG. 5C shows the structural details of the inner portion of the carrier rings 300 and 350 that are identical. The structural details of the carrier rings 300 and 350 are described below with reference to the carrier ring 350. It should be understood that other than the through holes, the description of the carrier ring 350 is identical for the carrier ring 300.

The carrier ring 350 comprises an inner portion having an inner diameter (ID) and an outer portion having an outer diameter (OD). The inner portion of the carrier ring 350 includes a first portion 352 that descends from a top surface 354 of the carrier ring 350. A second portion 356 of the carrier ring 350 extends from a bottom end of the first portion 352 horizontally (i.e., parallel to the top surface 354 of the carrier ring 350) towards the wafer 202. A third portion 358 of the carrier ring 350 descends vertically (i.e., perpendicular to the top surface 354 of the carrier ring 350) from a distal end of the second portion 356 of the carrier ring 350. A fourth portion 360 of the carrier ring 350 descends from a bottom end of the third portion 358 of the carrier ring 350 towards the outer diameter (OD) or the outer portion of the carrier ring 350 at a first acute angle relative to the second portion 356 or the top surface 354 of the carrier ring 350.

A fifth portion 362 of the carrier ring 350 extends horizontally (i.e., parallel to the top surface 354 of the carrier ring 350) from a bottom end of the fourth portion 360 of the carrier ring 350 towards the outer diameter (OD) or the outer portion of the carrier ring 350. A sixth portion 364 of the carrier ring 350 descends from a distal end of the fifth portion 362 of the carrier ring 350 towards the outer diameter (OD) or the outer portion of the carrier ring 350 at a second acute angle relative to the second portion 356 or the top surface 354 of the carrier ring 350. A seventh portion 366 of the carrier ring 350 extends horizontally (i.e., parallel to the top surface 354 of the carrier ring 350) from a bottom end of the sixth portion 364 of the carrier ring 350 towards the outer portion or the outer diameter (OD) of the carrier ring 350.

The top surface 354 of the carrier ring 350 is coplanar with a top surface of the wafer 202. The first portion 352 of the carrier ring 350 descends vertically (i.e., perpendicularly) from the top surface 354 of the carrier ring 350 for a distance that is approximately equal to a thickness of the wafer 202. The first portion 352 of the carrier ring 350 is spaced from an outer edge (e.g., an OD) of the wafer 202 by a predetermined distance. The distal end of the second portion 356 of the carrier ring 350 extends under the outer edge of the wafer 202. A first end of the third portion 358 of the carrier ring 350 forms a right angle (i.e., a sharp corner) at the distal end of the second portion 356 of the carrier ring 350. The fourth portion 360 of the carrier ring 350 descends at a 30 degree angle relative to the second portion 356 and the top surface 354 of the carrier ring 350.

The carrier ring 350 (but not the carrier ring 300) comprises a plurality of through holes 370 extending from the top surface 354 of the carrier ring 350 through the fifth portion 362 of the carrier ring 350. The through holes 370 of the carrier ring 350 have a predetermined diameter and are arranged at a predetermined radial distance from the first portion 352 of the carrier ring 350. The through holes 370 of the carrier ring 350 descend from the top surface 354 of the carrier ring 350 to the fifth portion 362 of the carrier ring 350 at an angle other than 90 degrees. For example, the through holes 370 descend from the top surface 354 of the carrier ring 350 to the fifth portion 362 of the carrier ring 350 at a 45 degree angle relative to the first portion 352 of the carrier ring 350 that descends vertically (i.e., perpendicularly) from the top surface 354 of the carrier ring 350. Stated differently, the through holes 370 of the carrier ring 350 descend from the top surface 354 of the carrier ring 350 to the fifth portion 362 of the carrier ring 350 at a 45 degree angle relative to the top surface 354 of the carrier ring 350.

Figure 6C:
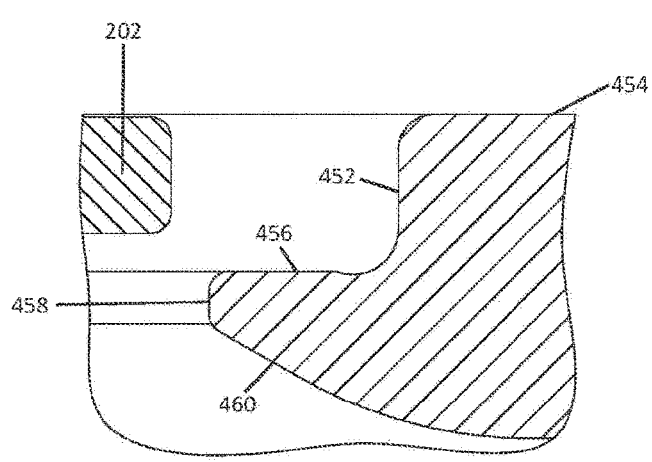

FIGS. 6A-6C show the third design (i.e., the third design of surface profile) of carrier rings 400 and 450 according to the present disclosure in detail. The carrier rings 400 and 450 are annular or have a ring shaped structure to surround a semiconductor substrate (e.g., the wafer 202) in a processing chamber. FIG. 6A shows the carrier ring 400 without through holes. FIG. 6B shows the carrier ring 450 with through holes. FIG. 6C shows the structural details of the inner portion of the carrier rings 400 and 450 that are identical. The structural details of the carrier rings 400 and 450 are described below with reference to the carrier ring 450. It should be understood that other than the through holes, the description of the carrier ring 450 is identical for the carrier ring 400.

The carrier ring 450 comprises an inner portion having an inner diameter (ID) and an outer portion having an outer diameter (OD). The inner portion of the carrier ring 450 includes a first portion 452 that descends from a top surface 454 of the carrier ring 450. From a bottom end of the first portion 452 of the carrier ring 450, a second portion 456 of the carrier ring 450 extends initially slightly upwards and subsequently horizontally (i.e., parallel to the top surface 454 of the carrier ring 450) outwards towards the wafer 202. A third portion 458 of the carrier ring 450 descends vertically (i.e., perpendicular to the top surface 454 of the carrier ring 450) from a distal end of the second portion 456 of the carrier ring 450. A fourth portion 460 of the carrier ring 450 descends from a bottom end of the third portion 458 of the carrier ring 450 towards the outer portion or the outer diameter (OD) of the carrier ring 450 at a first acute angle relative to the top surface 454 of the carrier ring 450.

A fifth portion 462 of the carrier ring 450 extends horizontally (i.e., parallel to the top surface 454 of the carrier ring 450) from a bottom end of the fourth portion 460 of the carrier ring 450 towards the outer diameter (OD) or the outer portion of the carrier ring 450. A sixth portion 464 of the carrier ring 450 descends from a distal end of the fifth portion 462 of the carrier ring 450 towards the outer diameter (OD) or the outer portion of the carrier ring 450 at a second acute angle relative to the top surface 454 of the carrier ring 450. A seventh portion 466 of the carrier ring 450 extends horizontally (i.e., parallel to the top surface 454 of the carrier ring 450) from a bottom end of the sixth portion 464 of the carrier ring 450 towards the outer portion or the outer diameter (OD) of the carrier ring 450.

The top surface 454 of the carrier ring 450 is coplanar with a top surface of the wafer 202. The first portion 452 descends vertically (i.e., perpendicularly) from the top surface 454 of the carrier ring 450 for a distance greater than a thickness of the wafer 202. The first portion 452 of the carrier ring 450 is spaced from an outer edge (e.g., an OD) of the wafer 202 by a predetermined distance. The horizontal portion of the second portion 456 of the carrier ring 450 is vertically spaced from a bottom surface of the wafer 202 by a first predetermined distance. The third portion 458 of the carrier ring 450 is horizontally spaced from an outer edge (e.g., the OD) of the wafer 202 by a second predetermined distance. The first and second predetermined distances may be equal.

The carrier ring 450 (but not the carrier ring 400) further comprises a plurality of through holes 470 extending from the top surface 454 of the carrier ring 450 through the fifth portion 462 of the carrier ring 450. The through holes 470 of the carrier ring 450 have a predetermined diameter and are arranged at a predetermined radial distance from the first portion 452 of the carrier ring 450. The through holes 470 of the carrier ring 450 descend from the top surface 454 of the carrier ring 450 to the fifth portion 462 of the carrier ring 450 at an angle other than 90 degrees. For example, the through holes 470 of the carrier ring 450 descend from the top surface 454 of the carrier ring 450 to the fifth portion 462 of the carrier ring 450 at a 45 degree angle relative to the first portion 452 that descends vertically (i.e., perpendicularly) from the top surface 454 of the carrier ring 450. Stated differently, the through holes 470 of the carrier ring 450 descend from the top surface 454 of the carrier ring 450 to the fifth portion 462 of the carrier ring 450 at a 45 degree angle relative to the top surface 454 of the carrier ring 450.

FIGS. 7A and 7B show the fourth design (i.e., the fourth design of surface profile) of carrier rings 500 and 550 according to the present disclosure in detail. The carrier rings 500 and 550 are annular or have a ring shaped structure to surround a semiconductor substrate (e.g., the wafer 202) in a processing chamber. FIG. 7A shows the carrier ring 500 without through holes. FIG. 7B shows the carrier ring 550 with through holes. The structural details of the carrier rings 500 and 550 are identical except that the carrier ring 500 is without through holes and the carrier ring 550 is with the through holes. Accordingly, the structural details of the carrier rings 500 and 550 are described below with reference to the carrier ring 550. It should be understood that other than the through holes, the description of the carrier ring 550 is identical for the carrier ring 500.

The carrier ring 550 comprises an inner portion having an inner diameter (ID) and an outer portion having an outer diameter (OD). The inner portion of the carrier ring 550 includes a first portion 552 that descends from a top surface 554 of the carrier ring 550. A second portion 556 of the carrier ring 550 extends from a bottom end of the first portion 552 of the carrier ring 550 horizontally (i.e., parallel to the top surface 554 of the carrier ring 550) towards the outer diameter (OD) or the outer portion of the carrier ring 550. A third portion 558 of the carrier ring 550 descends from a distal end of the second portion 556 of the carrier ring 550 towards the outer diameter (OD) or the outer portion of the carrier ring 550 at an acute angle relative to the second portion 556 or the top surface 554 of the carrier ring 550. A fourth portion 560 of the carrier ring 550 extends horizontally (i.e., parallel to the top surface 554 of the carrier ring 550) from a bottom end of the third portion 558 of the carrier ring 550 towards the outer portion or the outer diameter (OD) of the carrier ring 550.

The top surface 554 of the carrier ring 550 is coplanar with a top surface of the wafer 202. The first portion 552 of the carrier ring 550 descends vertically (i.e., perpendicularly) from the top surface 554 of the carrier ring 550 for a distance that is approximately equal to a thickness of the wafer 202. The first portion 552 of the carrier ring 550 is spaced from an outer edge (e.g., an OD) of the wafer 202 by a predetermined distance.

The carrier ring 550 further comprises a plurality of through holes 570 extending from the top surface 454 of the carrier ring 550 through the second portion 556 of the carrier ring 550. The through holes 570 of the carrier ring 550 have a predetermined diameter and are arranged at a predetermined radial distance from the first portion 552 of the carrier ring 550. The through holes 570 of the carrier ring 550 are closer to the distal end of the second portion 556 of the carrier ring 550 than to the first portion 552 of the carrier ring 550. The through holes 570 of the carrier ring 550 descend vertically (i.e., perpendicularly) from the top surface 554 of the carrier ring 550 to the second portion 556 of the carrier ring 550.

The following description is common for the above carrier ring designs. All the junctions between the various portions (e.g., between the top surface and the first portion, the first portion and the second portion, and so on) of the inner portions of the carrier rings are rounded or curved, except where a junction between two portions is specifically described as being or forming a sharp corner.

The inner diameter (ID) of the carrier ring determines a gap between the wafer edge and the carrier ring ID. The smaller the gap, the greater the reduction in the concentration of the deposition material at the wafer's front side. However, changing (i.e., increasing or decreasing) the carrier ring ID beyond an optimal ID has an effect on the concentration of the deposition material at the wafer's front side. For example, increasing the ID beyond the optimal ID increases deposition on the wafer's front side and bevel/edge. Decreasing the ID further beyond the optimal ID can increase the concentration of deposition material at the wafer's front side.

The profile angle (i.e., acute angle of a portion) of the inner portion of the carrier rings shown in FIGS. 5A-6C can be between 15 and 45 degrees, preferably 30 degrees.

Changing the lower profile of the inner portion of the carrier rings can have some effect on the concentration of deposition material at the wafer's back side and bevel edge. The 30 degree angle affects deposition on the whole back side of the wafer (i.e., affects the uniformity of film deposition).

The through holes are radially located on the carrier ring. The through holes are equidistant from each other. The total number of the through holes can be about 120. The radial location of the through holes is such that the through holes are closer to the ID than the OD of the carrier rings. Moving the through holes towards the OD of the carrier rings only minimally increases the concentration of deposition material at the wafer's front side and bevel/edge with no effect to the deposition of material at the wafer's backside.

The diameter of the through holes can be about 1 mm or smaller or larger. A smaller diameter can decrease the concentration of the deposition material at the wafer's front side and bevel/edge with no effect to the deposition of material at the wafer's backside. Making the through holes larger beyond an optimum diameter increases front side and bevel/edge deposition. The diameter of the through holes has a larger effect than the radial location of the through holes on the concentration of deposition material at the wafer's bevel/edge and backside.

Adding the through holes provides better control in preventing deposition on the wafer's bevel/edge and front side without any detrimental effect on film uniformity on the wafer's back side. The through holes can be vertical or slanted relative to the top surface of the carrier ring. The angle of the through holes can be between 30 degrees and 90 degrees (i.e., vertical) relative to the top surface of the carrier ring. An angle of 45 degrees is preferable to minimize purge gas flow losses as well as to minimize deposition on the wafer's bevel/edge and front side. An angle of 90 degrees is easier to machine (i.e., manufacture).

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A carrier ring for supporting a substrate of thickness T during semiconductor processing operations, the carrier ring comprising a ring structure having an inner diameter and an outer diameter, wherein:
    the ring structure has a cross-sectional profile having at least a first portion, a second portion, a third portion, a fourth portion, a fifth portion, and a sixth portion,
    the ring structure has a top surface that connects with the first portion,
    the first portion connects with the second portion, is not coplanar with the top surface, and is perpendicular to the top surface,
    the second portion connects with the third portion and is offset from the top surface in a direction perpendicular to the top surface by a distance approximately equal to the thickness T,
    the third portion connects with the fourth portion,
    the fourth portion connects with the fifth portion,
    the fifth portion connects with the sixth portion,
    the third portion defines the inner diameter,
    the second portion is located between a plane defined by the top surface and a plane defined by the fourth portion,
    the fourth portion transitions to the fifth portion via a rounded transition, and
    the fifth portion is at an acute angle relative to the top surface, extends around the circumference of
    the ring structure, and is sloped such that a thickness of the carrier ring between the fifth portion and the top surface increases with increasing distance from a center of the ring structure, and
    the sixth portion is parallel to the top surface.

2. The carrier ring of claim 1, wherein the fourth portion is parallel to the top surface.

3. The carrier ring of claim 1, wherein the distance that the top surface is offset from the second portion in the direction perpendicular to the top surface is equal to the thickness T.

4. The carrier ring of claim 1, wherein the acute angle is 30°.

5. The carrier ring of claim 1, wherein the top surface is planar.

6. The carrier ring of claim 1, further comprising, a plurality of tabs spaced about, and extending radially inward from, an interior edge of the carrier ring.

7. The carrier ring of claim 6, wherein the plurality of tabs includes exactly six tabs.

8. The carrier ring of claim 6, wherein the tabs have substrate support surfaces that are configured to support the substrate.

9. The carrier ring of claim 8, wherein the substrate support surfaces are interposed between the second portion and the top surface.

10. The carrier ring of claim 9, wherein the second portion is offset from the top surface by a distance that is greater than or equal to a thickness of the substrate plus a distance between the substrate support surfaces and the second portion.

11. The carrier ring of claim 10, further comprising a sixth portion that connects with the fifth portion.

12. The carrier ring of claim 11, further comprising a plurality of standoffs that protrude from the sixth portion.

13. The carrier ring of claim 12, wherein the plurality of standoffs includes exactly three standoffs.

14. The carrier ring of claim 11, wherein the connection between the fifth portion and the sixth portion is rounded.

15. The carrier ring of claim 1, wherein the connection between the top surface and the first portion is rounded.

16. The carrier ring of claim 1, wherein the connection between the third portion and the fourth portion is rounded.

17. The carrier ring of claim 1, wherein the first portion defines a diameter that is larger than a diameter of the substrate.

18. The carrier ring of claim 17, wherein the third portion defines the inner diameter and the inner diameter is less than the diameter of the substrate.

\* \* \* \* \*